US012348189B2

(12) United States Patent
Ripley et al.

(10) Patent No.: US 12,348,189 B2
(45) Date of Patent: Jul. 1, 2025

(54) POWER AMPLIFIERS WITH SUPPLY CAPACITOR SWITCHING

(71) Applicant: Skyworks Solutions, Inc., Irvine, CA (US)

(72) Inventors: David Steven Ripley, Cedar Rapids, IA (US); Dong Ding, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 554 days.

(21) Appl. No.: 17/650,416

(22) Filed: Feb. 9, 2022

(65) Prior Publication Data

US 2022/0278650 A1   Sep. 1, 2022

Related U.S. Application Data

(60) Provisional application No. 63/200,293, filed on Feb. 26, 2021.

(51) Int. Cl.
   *H03F 1/02*   (2006.01)
   *H03F 3/24*   (2006.01)
   *H04B 1/04*   (2006.01)

(52) U.S. Cl.
   CPC .......... *H03F 1/0233* (2013.01); *H03F 3/245* (2013.01); *H04B 1/04* (2013.01);
   (Continued)

(58) Field of Classification Search
   CPC ...... H03F 1/0233; H03F 1/223; H03F 1/0211; H03F 3/245; H03F 2200/105;
   (Continued)

(56) References Cited

U.S. PATENT DOCUMENTS 5,264,752 A   11/1993   Savicki
6,774,725 B2   8/2004   Miki et al.
(Continued)

FOREIGN PATENT DOCUMENTS

CN   1672322   9/2005
GB   2398648   8/2004
(Continued)

OTHER PUBLICATIONS

International Search Report and Written Opinion in PCT/US2011/064720, dated Mar. 19, 2012.
(Continued)

*Primary Examiner* — Andrea Lindgren Baltzell
*Assistant Examiner* — Nareh Shamiryan
(74) *Attorney, Agent, or Firm* — Knobbe, Martens, Olson & Bear, LLP

(57) ABSTRACT

Power amplifiers with supply capacitor switching are provided herein. In certain embodiments, a power amplifier system includes a power amplifier that provides amplification to a radio frequency (RF) signal, a power management circuit that controls a voltage level of a supply voltage of the power amplifier, a supply capacitor having a first end connected to the supply voltage, and a bulk n-type field-effect transistor (NFET) switch. The power management circuit is operable in multiple supply control modes (for example, an average power tracking mode and an envelope tracking mode). Additionally, the bulk NFET switch is controlled based on the supply control mode of the power management circuit. The bulk NFET switch includes a ground NFET in series with a second end of the supply capacitor and a ground voltage, and a discharge NFET connected between the second end of the supply capacitor and the supply voltage.

20 Claims, 10 Drawing Sheets

(52) U.S. Cl.
CPC .. *H03F 2200/105* (2013.01); *H03F 2200/451* (2013.01); *H04B 2001/045* (2013.01)

(58) Field of Classification Search
CPC ................ H03F 2200/451; H04B 1/04; H04B 2001/045; H03K 17/687
See application file for complete search history.

(56) References Cited

U.S. PATENT DOCUMENTS

| | | | |
|---|---|---|---|
| 6,975,166 | B2 | 12/2005 | Grillo et al. |
| 7,139,538 | B2 | 11/2006 | Ono et al. |
| 7,400,865 | B2 | 7/2008 | Jarvinen |
| 7,482,869 | B2 | 1/2009 | Wilson |
| 7,486,135 | B2 | 2/2009 | Mu |
| 7,760,026 | B2 | 7/2010 | Young et al. |
| 8,598,950 | B2 | 12/2013 | Khesbak |
| 9,166,538 | B2 | 10/2015 | Hong et al. |
| 9,257,940 | B2 | 2/2016 | Khesbak |
| 9,377,797 | B2 | 6/2016 | Kay et al. |
| 9,548,702 | B2 | 1/2017 | Khesbak |
| 9,859,846 | B2 | 1/2018 | Khesbak |
| 11,271,599 | B2 * | 3/2022 | Mirea ................... H03F 1/0227 |
| 11,387,789 | B2 | 7/2022 | Khlat et al. |
| 2002/0030543 | A1 | 3/2002 | French et al. |
| 2003/0155978 | A1 | 8/2003 | Pehlke |
| 2006/0178119 | A1 | 8/2006 | Jarvinen |
| 2007/0210771 | A1 | 9/2007 | Wilson et al. |
| 2007/0249304 | A1 | 10/2007 | Snelgrove et al. |
| 2007/0273449 | A1 | 11/2007 | Wilson |
| 2007/0279019 | A1 | 12/2007 | Wilson |
| 2009/0128236 | A1 | 5/2009 | Wilson |
| 2009/0289720 | A1 | 11/2009 | Takinami et al. |
| 2009/0295475 | A1 | 12/2009 | Bar-David et al. |
| 2009/0302941 | A1 | 12/2009 | Wimpenny |
| 2014/0184334 | A1 | 7/2014 | Nobbe et al. |
| 2016/0118943 | A1 | 4/2016 | Khesbak |
| 2020/0389132 | A1 | 12/2020 | Khlat et al. |
| 2021/0019451 | A1 | 1/2021 | Anson |
| 2021/0194517 | A1 | 6/2021 | Mirea et al. |
| 2022/0014152 | A1 | 1/2022 | Gebeyehu et al. |

FOREIGN PATENT DOCUMENTS

| | | |
|---|---|---|
| GB | 2409115 | 11/2006 |
| GB | 2426392 | 5/2007 |
| GB | 2411062 | 11/2007 |
| JP | 2008-148098 | 6/2008 |
| JP | 2008-294812 | 12/2008 |
| JP | 2013-511242 | 3/2013 |
| JP | 2015-507452 | 3/2015 |
| JP | 2016-149751 | 8/2016 |
| JP | 2017-195536 | 10/2017 |
| JP | 2020-516194 | 5/2020 |
| JP | 2020-120368 | 8/2020 |
| KR | 10-2009-0103952 | 10/2009 |
| WO | WO 2008/091325 | 7/2008 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009 (6 pages).

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.

* cited by examiner

POWER AMPLIFIERS WITH SUPPLY CAPACITOR SWITCHING

CROSS-REFERENCE TO RELATED APPLICATIONS

This application claims the benefit of priority under 35 U.S.C. § 119 of U.S. Provisional Patent Application No. 63/200,293, filed Feb. 26, 2021 and titled "POWER AMPLIFIERS WITH SUPPLY CAPACITOR SWITCHING," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. Power amplifiers provide amplification to RF signals, which can have a frequency in the range from about 30 kHz to 300 GHz, such as in the range of about 410 MHz to about 7.125 GHz for fifth generation (5G) communications using Frequency Range 1 (FR1) or in the range of about 24.25 GHz to 52.6 GHz for 5G communications using Frequency Range 2 (FR2).

SUMMARY

In certain embodiments, the present disclosure relates to a mobile device. The mobile device includes a power amplifier configured to amplify a radio frequency signal, a power management circuit configured to control a voltage level of a supply voltage of the power amplifier and operable in a selected supply control mode chosen from a plurality of supply control modes, and a front end system including a supply capacitor having a first end connected to the supply voltage, an n-type field-effect transistor ground switch connected between a second end of the supply capacitor and a ground voltage, and an n-type field-effect transistor discharge switch connected between the second end of the supply capacitor and the supply voltage. The n-type field-effect transistor ground switch and the n-type field-effect transistor discharge switch controlled based on the selected supply control mode.

In some embodiments, the plurality of supply control modes includes an average power tracking mode and an envelope tracking mode. According to a number of embodiments, the n-type field-effect transistor ground switch is configured to turn on in the average power tracking mode and turn off in the envelope tracking mode, and the n-type field-effect transistor discharge switch is configured to turn off in the average power tracking mode and turn on in the envelope tracking mode.

In various embodiments, the n-type field-effect transistor discharge switch includes two or more n-type field-effect transistors in series. In accordance with several embodiments, the front-end system further includes a voltage divider configured to bias the two or more n-type field-effect transistors. According to a number of embodiments, the voltage divider includes a first terminal connected to the supply voltage and a second terminal connected to the ground voltage through a mode transistor. In accordance with some embodiments, the plurality of supply control modes includes an average power tracking mode and an envelope tracking mode, the mode transistor configured to turn on in the envelope tracking mode and turn off in the average power tracking mode.

In several embodiments, the n-type field-effect transistor ground switch and the n-type field-effect transistor discharge switch are implemented on a semiconductor die fabricated using a bulk silicon process.

In certain embodiments, the present disclosure relates to a packaged module. The packaged module includes a package substrate, and a first die attached to the package substrate and including a power amplifier configured to amplify a radio frequency signal and to receive power from a supply voltage controlled by a power management circuit. The packaged module further includes a supply capacitor attached to the package substrate and having a first end connected to the supply voltage, and a second die attached to the package substrate and fabricated using a bulk silicon process. The second die includes an n-type field-effect transistor ground switch connected between a second end of the supply capacitor and a ground voltage, and an n-type field-effect transistor discharge switch connected between the second end of the supply capacitor and the supply voltage.

In various embodiments, the power management circuit is operable in a selected supply control mode indicating one of an average power tracking mode or an envelope tracking mode, the n-type field-effect transistor ground switch and the n-type field-effect transistor discharge switch controlled based on the selected supply control mode. According to several embodiments, the n-type field-effect transistor ground switch is configured to turn on in the average power tracking mode and turn off in the envelope tracking mode, and the n-type field-effect transistor discharge switch is configured to turn off in the average power tracking mode and turn on in the envelope tracking mode.

In some embodiments, the n-type field-effect transistor discharge switch includes two or more n-type field-effect transistors in series. According to a number of embodiments, the second die further includes a voltage divider configured to bias the two or more n-type field-effect transistors. In accordance with several embodiments, the voltage divider includes a first terminal connected to the supply voltage and a second terminal connected to the ground voltage through a mode transistor.

In various embodiments, the packaged module further includes a supply pin configured to receive the supply voltage, the power management circuit external to the package module.

In certain embodiments, the present disclosure relates to a power amplifier system. The power amplifier system includes a power amplifier configured to amplify a radio frequency signal, a power management circuit configured to control a voltage level of a supply voltage of the power amplifier and operable in a selected supply control mode chosen from a plurality of supply control modes, a supply capacitor having a first end connected to the supply voltage, an n-type field-effect transistor ground switch connected between a second end of the supply capacitor and a ground voltage, and an n-type field-effect transistor discharge switch connected between the second end of the supply capacitor and the supply voltage. The n-type field-effect transistor ground switch and the n-type field-effect transistor discharge switch controlled based on the selected supply control mode.

In various embodiments, the plurality of supply control modes includes an average power tracking mode and an envelope tracking mode. According to a number of embodiments, the n-type field-effect transistor ground switch is configured to turn on in the average power tracking mode and turn off in the envelope tracking mode, and the n-type field-effect transistor discharge switch is configured to turn off in the average power tracking mode and turn on in the envelope tracking mode.

In several embodiments, the n-type field-effect transistor discharge switch includes two or more n-type field-effect transistors in series. According to a number of embodiments, the power amplifier system further includes a voltage divider configured to bias the two or more n-type field-effect transistors. In accordance with various embodiments, the voltage divider includes a first terminal connected to the supply voltage and a second terminal connected to the ground voltage through a mode transistor. According to some embodiments, the plurality of supply control modes includes an average power tracking mode and an envelope tracking mode, the mode transistor configured to turn on in the envelope tracking mode and turn off in the average power tracking mode.

In various embodiments, the n-type field-effect transistor ground switch and the n-type field-effect transistor discharge switch are implemented on a semiconductor die fabricated using a bulk silicon process.

In certain embodiments, the present disclosure relates to a method of power amplification. The method includes amplifying a radio frequency signal using a power amplifier, and controlling a voltage level of a supply voltage of the power amplifier using a power management circuit, the supply voltage coupled to a first end of a supply capacitor. The method further includes operating the power management circuit in a selected supply control mode chosen from a plurality of supply control modes, and controlling an n-type field-effect transistor ground switch based on the selected supply control mode, the n-type field-effect transistor ground switch connected between a second end of the supply capacitor and a ground voltage. The method further includes controlling an n-type field-effect transistor discharge switch based on the selected supply control mode, the n-type field-effect transistor ground switch connected between the second end of the supply capacitor and the supply voltage.

In various embodiments, the plurality of supply control modes includes an average power tracking mode and an envelope tracking mode. According to several embodiments, the method further includes turning on the n-type field-effect transistor ground switch in the average power tracking mode and turning off the n-type field-effect transistor ground switch in the envelope tracking mode. In accordance with some embodiments, the method further includes turning off the n-type field-effect transistor discharge switch in the average power tracking mode and turning on the n-type field-effect transistor discharge switch in the envelope tracking mode.

DETAILED DESCRIPTION OF EMBODIMENTS

Figure 1:
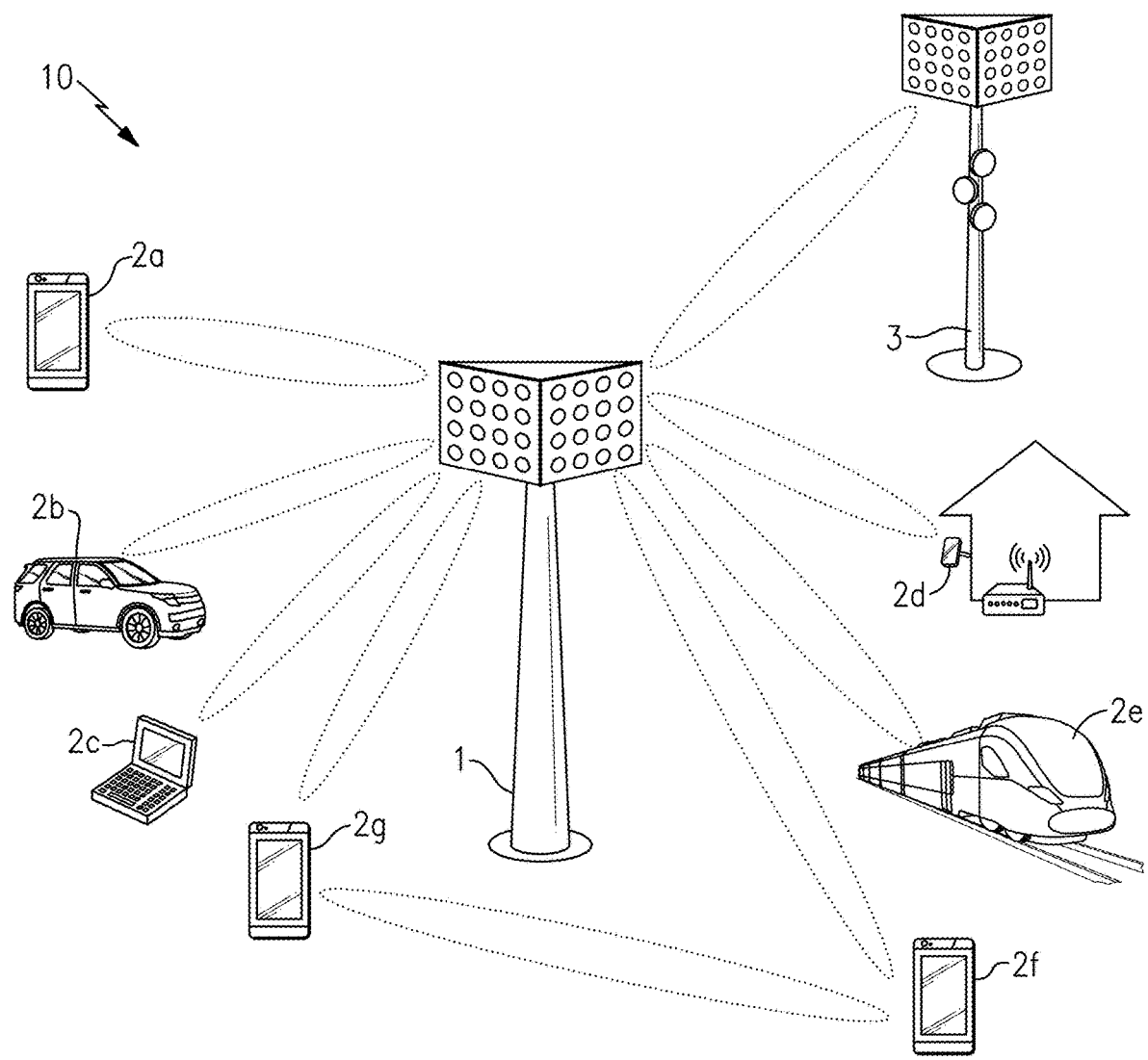
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such Wi-Fi®. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and Wi-Fi® technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi® frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
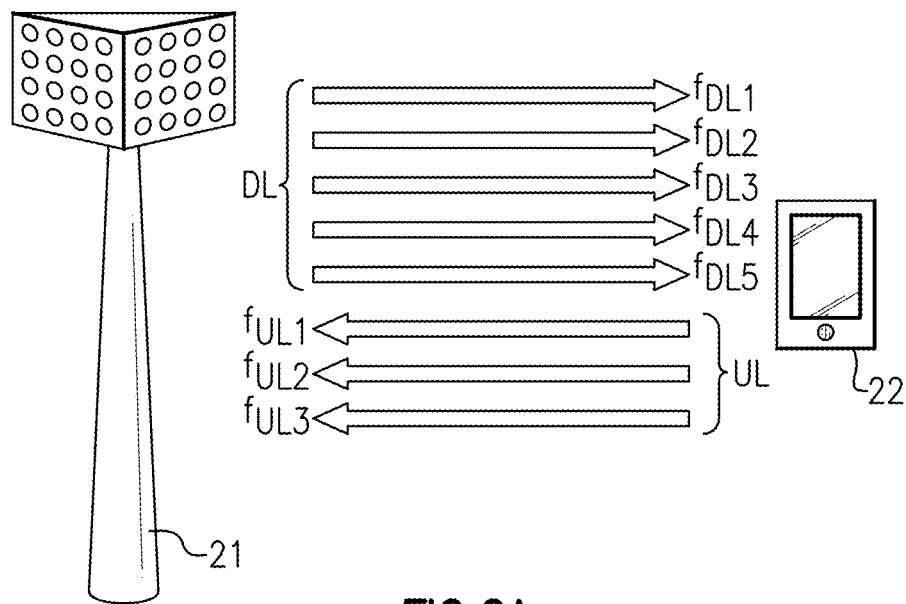
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
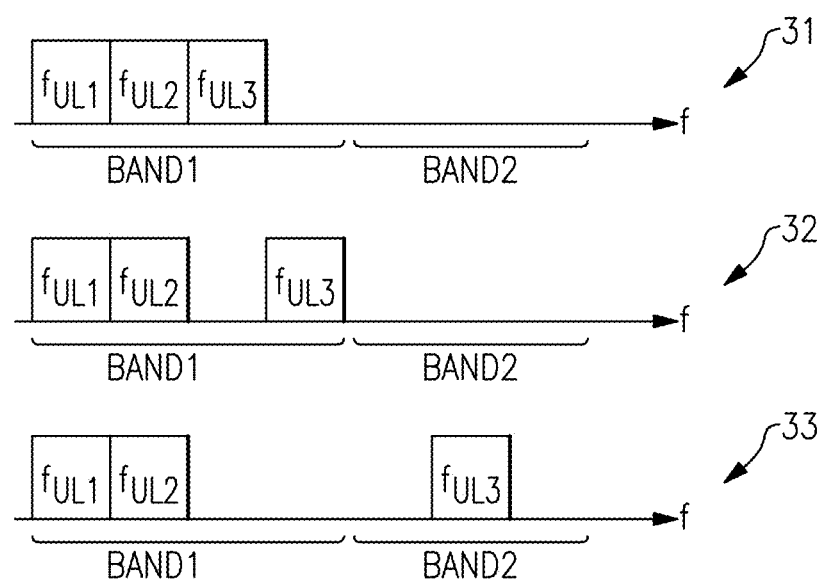
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
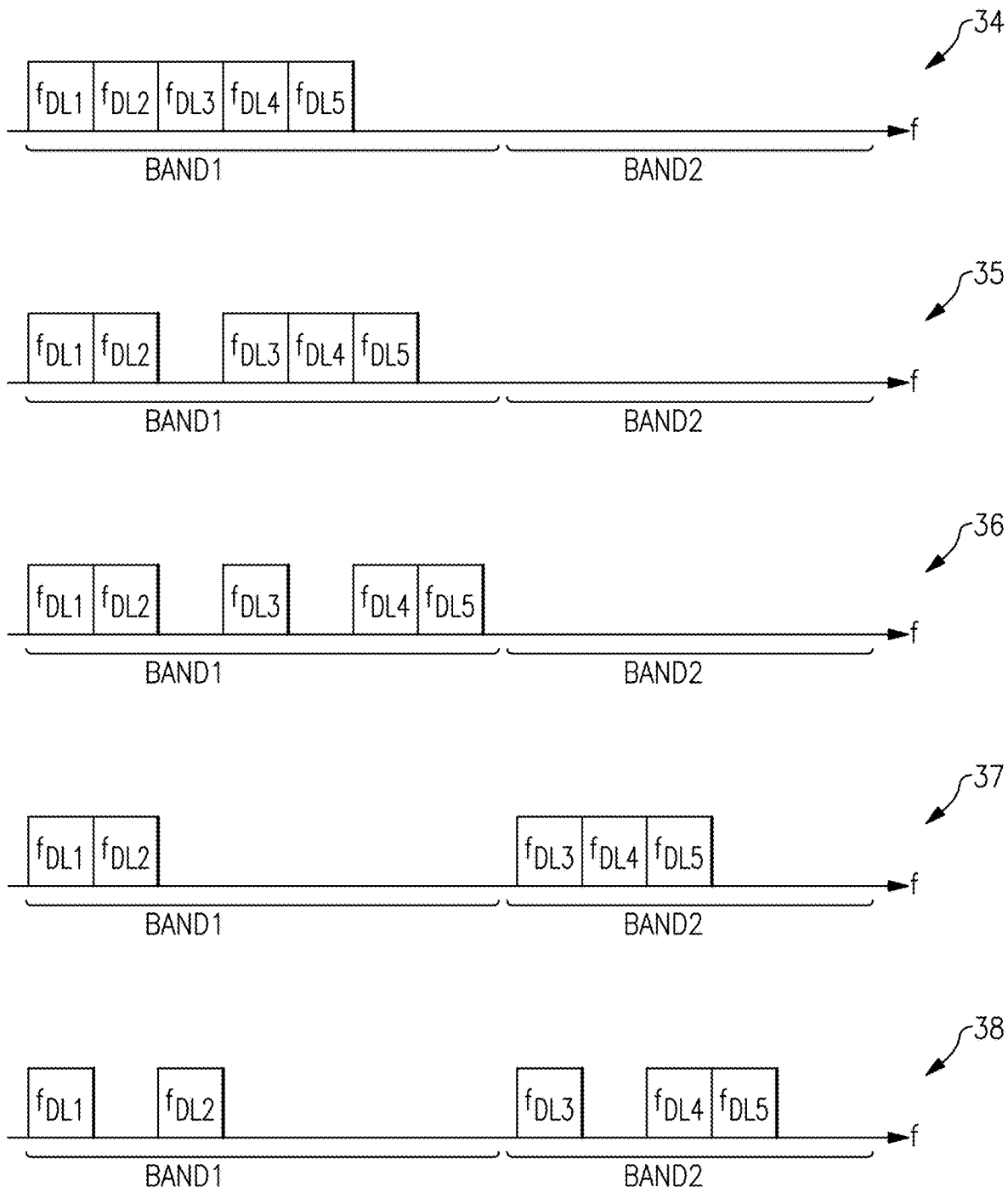
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such Wi-Fi®. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid Wi-Fi® users and/or to coexist with Wi-Fi® users. Enhanced license assisted access (eLAA) refers to an evolution of LAA that aggregates licensed and unlicensed spectrum for both downlink and uplink.

Power Amplifiers with Supply Capacitor Switching

In mobile applications, such as cellular communication systems, it is important to prolong battery lifetime. One operation that consumes a significant amount of battery charge is power amplification, or amplifying RF signals for wireless transmission.

To increase efficiency and thereby extend battery life, a mobile device can include a power management circuit for controlling a voltage level of the power amplifier's supply voltage. For example, the power management circuit can employ various power management techniques to change the voltage level of the power amplifier's supply voltage over time to improve the power amplifier's power added efficiency (PAE), thereby reducing power dissipation and extending battery life.

One technique for power management of a power amplifier is average power tracking (APT), in which a DC-to-DC converter or other suitable voltage regulator is used to generate a supply voltage for a power amplifier based on the power amplifier's average output power. For example, when providing APT, the supply voltage can be set to a particular voltage level over a time interval (for instance, set at a fixed voltage level over a transmit frame) based on the average output power over the time interval.

Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

Power amplifier systems can be multi-mode and specified to operate in a linear mode with a static DC supply (APT mode) or in a quasi-compressed mode with a dynamically changing supply (ET mode).

4G/5G waveforms include amplitude modulated (AM) characteristics that result in rapidly changing current characteristics in the power amplifier. Moreover, finite impedances of the power amplifier supply network can result in degradation of the power amplifier linearity, and thus it can be desirable to have large value capacitance on the supply network during APT operation. Conversely, during ET operation, the power amplifier supply is specified to support high frequency modulation and is unable to tolerate a large amount of capacitance on the power amplifier supply network.

For example, a mobile device can include a shared power management circuit that can be configured in an APT mode or in an ET mode depending on the signal power level and operating characteristics, for instance, whether using 3G, 4G, and/or 5G waveforms. In an APT mode, it is desirable for the power management circuit to drive large capacitance (for instance, in the range of 1 uF) whereas in an ET mode (particularly for 5G applications) it can be desirable for the load capacitance to be limited to a few hundreds of pF for wide envelope tracking bandwidth. For a 5G application in APT mode, it is desirable for a power amplifier to operate with a large supply capacitance in the range of a few nano-farads (nF) to meet the adjacent channel power ratio (ACPR) and/or adjacent channel leakage ratio (ACLR) specifications.

Power amplifiers with supply capacitor switching are provided herein. In certain embodiments, a power amplifier system includes a power amplifier that provides amplification to an RF signal, a power management circuit that controls a voltage level of a supply voltage of the power amplifier, a supply capacitor having a first end connected to the supply voltage, and a bulk n-type field-effect transistor (NFET) switch. The power management circuit is operable in multiple supply control modes including, for example, an APT mode and an ET mode. Additionally, the bulk NFET switch is controlled based on the supply control mode of the power management circuit. The bulk NFET switch includes a ground NFET in series with a second end of the supply capacitor and a ground voltage, and a discharge NFET connected between the second end of the supply capacitor and the supply voltage.

Accordingly, a power amplifier can be designed to support multiple supply control modes, such as APT and ET modes, and operate with optimal or near optimal performance across such modes. Moreover, the supply capacitor can be switched using a low cost and low complexity switch solution utilizing only NFET devices in a bulk silicon technology.

In contrast, an approach using a p-type field-effect transistor (PFET) in bulk silicon can provide isolation (for instance, using a triple well CMOS process) to avoid voltage swings below ground and/or forward biasing of the substrate parasitics, but can suffer from a significant challenge in supporting low voltage DC supply conditions and/or additional well capacitance of the large PFET significantly limits the minimum capacitance state during ET mode. In another example, an NFET switch can be connected between a supply capacitor and ground and a charge pump can be used to bias a gate of the NFET switch above the supply voltage. However, this approach requires an additional pin interface to supply the charge pump circuitry and increases the risk of clock spurious signals (clock spurs) corrupting the power amplifier transmit spectrum. In yet another example, SOI technology can be used to avoid substrate effects, but adds significant cost due to the complex semiconductor process.

Figure 3A:
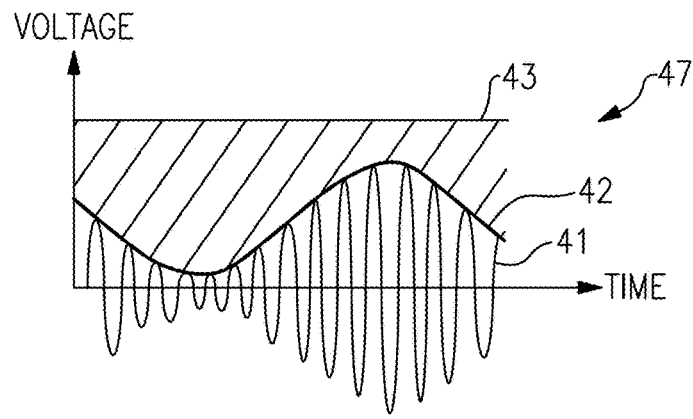
FIG. 3A is a graph showing a first example of power amplifier supply voltage versus time.

FIG. 3A is a graph 47 showing a first example of power amplifier supply voltage versus time. The graph 47 illustrates the voltage of an RF signal 41, the RF signal's envelope 42, and a power amplifier supply voltage 43 versus time. The graph 47 corresponds to one example of waveforms for an implementation in which the power amplifier supply voltage 43 is substantially fixed.

It can be important that the power amplifier supply voltage 43 of a power amplifier has a voltage greater than that of the RF signal 41. For example, powering a power amplifier using a power amplifier supply voltage that has a magnitude less than that of the RF signal can clip the RF signal, thereby creating signal distortion and/or other problems. Thus, it can be important the power amplifier supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a wireless device.

Figure 3B:
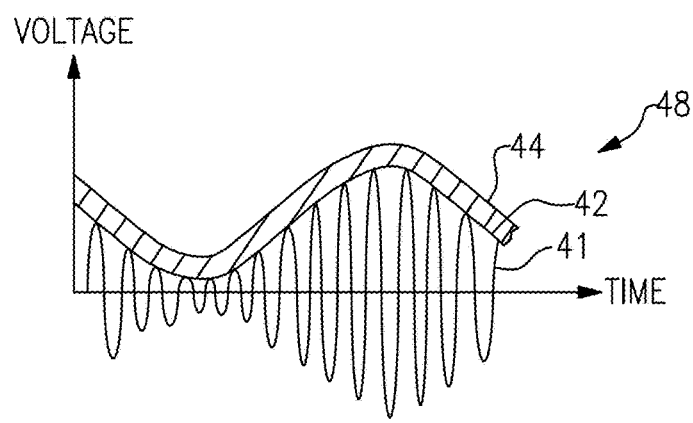
FIG. 3B is a graph showing a second example of power amplifier supply voltage versus time.

FIG. 3B is a graph 48 showing a second example of power amplifier supply voltage versus time. The graph 48 illustrates the voltage of an RF signal 41, the RF signal's envelope 42, and a power amplifier supply voltage 44 versus time. The graph 48 corresponds to one example of waveforms for an implementation in which the power amplifier supply voltage 44 is generated by envelope tracking.

Envelope tracking is a technique that can be used to increase power added efficiency (PAE) of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In contrast to the power amplifier supply voltage 43 of FIG. 3A, the power amplifier supply voltage 44 of FIG. 3B changes in relation to the envelope 42 of the RF signal 41. The area between the power amplifier supply voltage 44 and the envelope 42 in FIG. 3B is less than the area between the power amplifier supply voltage 43 and the envelope 42 in FIG. 3A, and thus the graph 48 of FIG. 3B can be associated with a power amplifier system having greater energy efficiency.

Figure 3C:
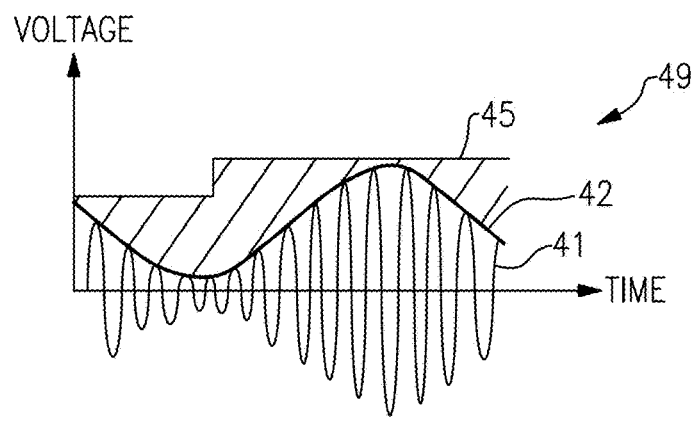
FIG. 3C is a graph showing a third example of power amplifier supply voltage versus time.

FIG. 3C is a graph 49 showing a third example of power amplifier supply voltage versus time. The graph 49 illustrates the voltage of an RF signal 41, the RF signal's envelope 42, and a power amplifier supply voltage 45 versus time. The graph 49 corresponds to one example of waveforms for an implementation in which the power amplifier supply voltage 45 is generated by average power tracking (APT).

APT is one technique for improving efficiency of a power amplifier, in which the voltage level of a power amplifier's supply voltage is controlled based on a power amplifier's average output power. When operating using APT, the voltage level of the power amplifier supply voltage can be substantially fixed for a particular time slot or interval, but adjusted for a subsequent time slot based on average output power (for instance, transmission power control level). APT can achieve gain in efficiency relative to a fixed power amplifier supply voltage, but less efficiency gain compared to envelope tracking. However, envelope tracking can have a higher complexity, cost, and/or overhead relative to APT.

Figure 4:
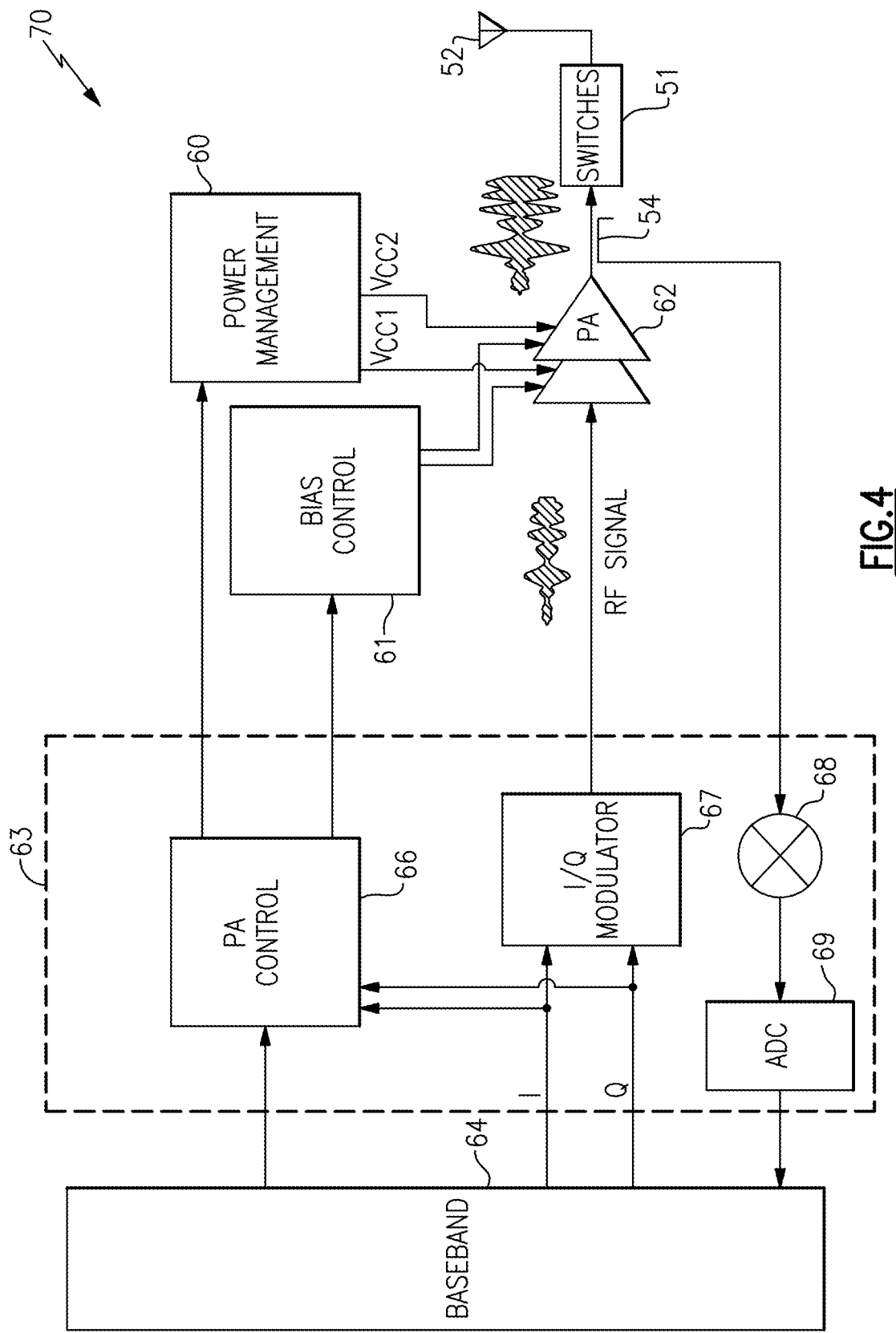
FIG. 4 is a schematic diagram of one embodiment of a power amplifier system.

FIG. 4 is a schematic diagram of one embodiment of a power amplifier system 70. The illustrated power amplifier system 70 includes switches 51, an antenna 52, a directional coupler 54, a power management circuit 60, a bias control circuit 61, a power amplifier 62, a transceiver 63, and a baseband processor 64.

Although FIG. 4 illustrates one embodiment of a power amplifier system, the teachings herein are applicable to power amplifier systems implemented in a wide variety of ways. For example, a power amplifier system can include more or fewer components, a different arrangement of components, and/or components implemented in different ways.

In the illustrated embodiment, the transceiver 63 includes a power amplifier control circuit 66, an I/Q modulator 67, a mixer 68, and an analog-to-digital converter (ADC) 69. Although not illustrated in FIG. 4 for clarity, the transceiver 63 can also process signals received from one or more antennas (for example, the antenna 52 and/or other antenna(s)) by way of one or more receive paths. Furthermore, the transceiver 63 can be implemented in other ways, including, but not limited to, using different implementations of transmit path(s), observation path(s), and/or power amplifier control circuitry.

The baseband signal processor 64 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 67 in a digital format. The baseband processor 64 can be any suitable processor configured to process a baseband signal. For instance, the baseband processor 64 can include a digital signal processor, a microprocessor, a programmable core, or any combination thereof. Moreover, in some implementations, two or more baseband processors 64 can be included in the power amplifier system 70.

The I/Q modulator 67 can be configured to receive the I and Q signals from the baseband processor 64 and to process the I and Q signals to generate an RF signal. For example, the I/Q modulator 67 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 62. In certain implementations, the I/Q modulator 67 can include one or more filters configured to filter frequency content of signals processed therein.

The power amplifier 62 can receive the RF signal from the I/Q modulator 67, and when enabled can provide an amplified RF signal to the antenna 52 via the switches 51. The directional coupler 54 can be positioned between the output of the power amplifier 62 and the input of the switches 51, thereby allowing an output power measurement of the power amplifier 62 that does not include insertion loss of the switches 51. However, other configurations of power measurement are possible.

The switches 51 includes an antenna switch and/or band switch, in this embodiment. The switches 51 can further include one or more supply control switches (each connected to a corresponding supply capacitor) implemented in accordance with the teachings herein. Such supply control switches can be used for any or all of the stages of the power amplifier 62.

In the illustrated configuration, the sensed output signal from the directional coupler 54 is provided to the mixer 68, which multiplies the sensed output signal by a reference signal of a controlled frequency. The mixer 68 operates to generate a downshifted signal by downshifting the sensed output signal's frequency content. The downshifted signal can be provided to the ADC 69, which can convert the downshifted signal to a digital format suitable for processing by the baseband processor 64. By including a feedback path between the output of the power amplifier 62 and the baseband processor 64, the baseband processor 64 can be configured to dynamically adjust the I and Q signals to optimize the operation of the power amplifier system 70. For example, configuring the power amplifier system 70 in this manner can aid in controlling the PAE and/or linearity of the power amplifier 62.

In the illustrated embodiment, the power management circuit 60 receives a power control signal from the transceiver 63, and controls the supply voltages of the power amplifier 62. In certain implementations, the transceiver 63 is electrically connected to the power management circuit 60 via a serial interface, and the power management circuit 60 receives the power control signal over the serial interface.

As shown in FIG. 4, the power management circuit 60 generates a first supply voltage $V_{CC1}$ for powering an input stage of the power amplifier 62 and a second supply voltage $V_{CC2}$ for powering an output stage of the power amplifier 62. The power management circuit 60 can control the voltage level of the first supply voltage $V_{CC1}$ and/or the second supply voltage $V_{CC2}$ to enhance the power amplifier system's PAE. Although an embodiment with two controllable supply voltages is shown, a power management circuit can control the voltage levels of more or fewer supply voltages. In certain implementations, a power amplifier operates with one or more controllable supply voltages and one or more substantially fixed supply voltages.

In the illustrated embodiment, the power control signal instructs the power management circuit 60 to operate in a particular supply control mode, such as an APT mode or an ET mode. Thus, the power amplifier control circuit 66 of the transceiver 63 controls the selected supply control mode, in this embodiment.

As shown in FIG. 4, the bias control circuit 61 receives a bias control signal from the transceiver 63, and generates bias control signals for the power amplifier 62. Additionally, the bias control circuit 61 generates the bias control signals based on the bias control signal.

The bias control signal identifies the supply control mode that the power management circuit 60 is operating in, and the bias control circuit 61 generates the bias control signals based on the indicated supply control mode. In certain implementations, the transceiver 63 is electrically connected to the bias control circuit 61 via a serial interface, and the bias control circuit 61 receives a control word that indicates the selected supply control mode over the serial interface.

Figure 5:
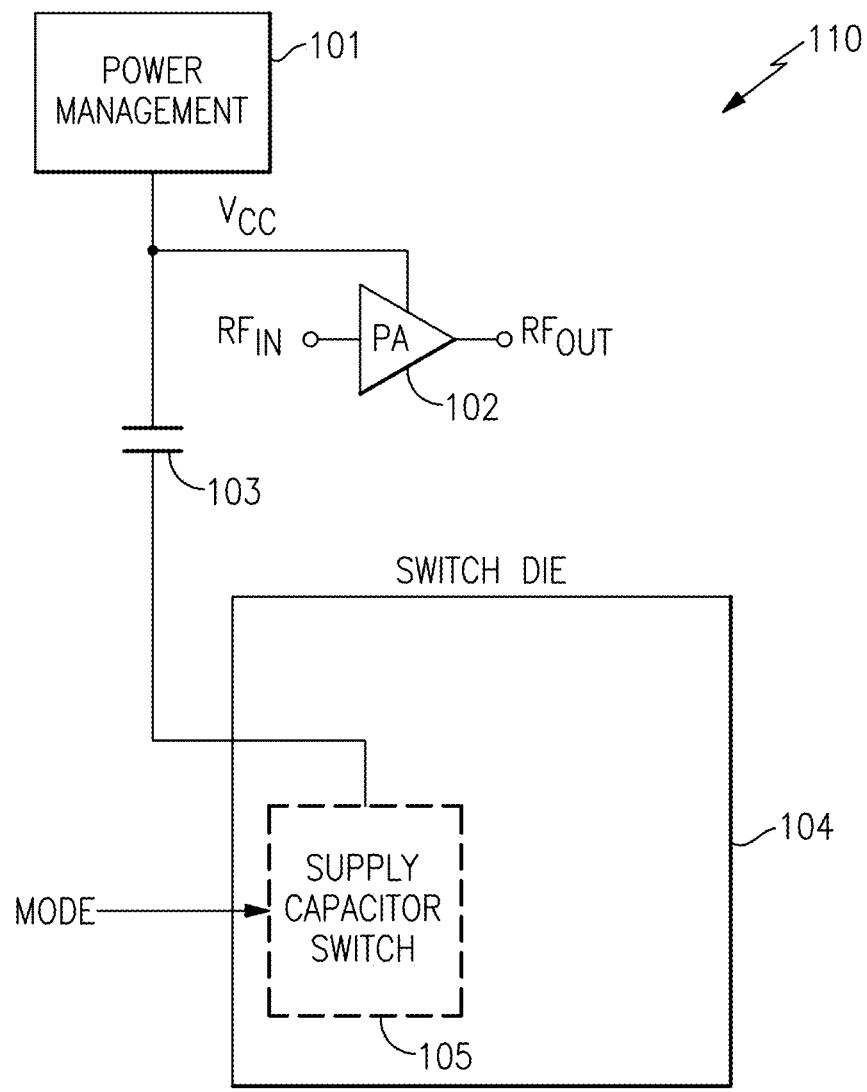
FIG. 5 is a schematic diagram of another embodiment of a power amplifier system.

FIG. 5 is a schematic diagram of another embodiment of a power amplifier system 110. The power amplifier system 110 includes a power management circuit 101, a power amplifier 102, a supply capacitor 103, and a switch die 104.

As shown in FIG. 5, the power amplifier 102 receives an RF input signal $RF_{IN}$, which the power amplifier 102 amplifies to generate an RF output signal $RF_{OUT}$. Although depicted as including a single stage, the power amplifier 102 can include additional stages. The power amplifier 102 receives a power amplifier supply voltage $V_{CC}$ from the power management circuit 101, which is also referred to herein as a power management integrated circuit (PMIC). In certain implementations, the power amplifier 102 includes a bipolar transistor having a collector that receives the power amplifier supply voltage $V_{CC}$ through a choke inductor, or a field-effect transistor (FET) having a drain that receives the power amplifier supply voltage $V_{CC}$ through the choke inductor.

The power management circuit 101 controls a voltage level of the power amplifier supply voltage $V_{CC}$ of the power amplifier 102. The power management circuit 101 is a multi-mode power management circuit operable in two or more modes which can include an APT mode and an ET mode.

As shown in FIG. 5, the switch die 104 incudes a supply capacitor switch 105, which can be implemented in accordance with any of the embodiments herein. In certain embodiments, the switch die 104 includes one or more other components to enhance integration.

The supply capacitor switch 105 is controlled (for instance, opened or closed) based on a mode of the power management circuit 101 indicated by a mode signal MODE.

As shown in FIG. 5, the supply capacitor 103 includes a first terminal (also referred to herein as a first end) connected to the power amplifier supply voltage $V_{CC}$ and a second terminal (also referred to herein as a second end) connected to the supply capacitor switch 105.

By controlling a state of the supply capacitor switch 105, the supply capacitor 103 can be selectively included for filtering/stabilizing the power amplifier supply voltage $V_{CC}$.

Figure 6A:
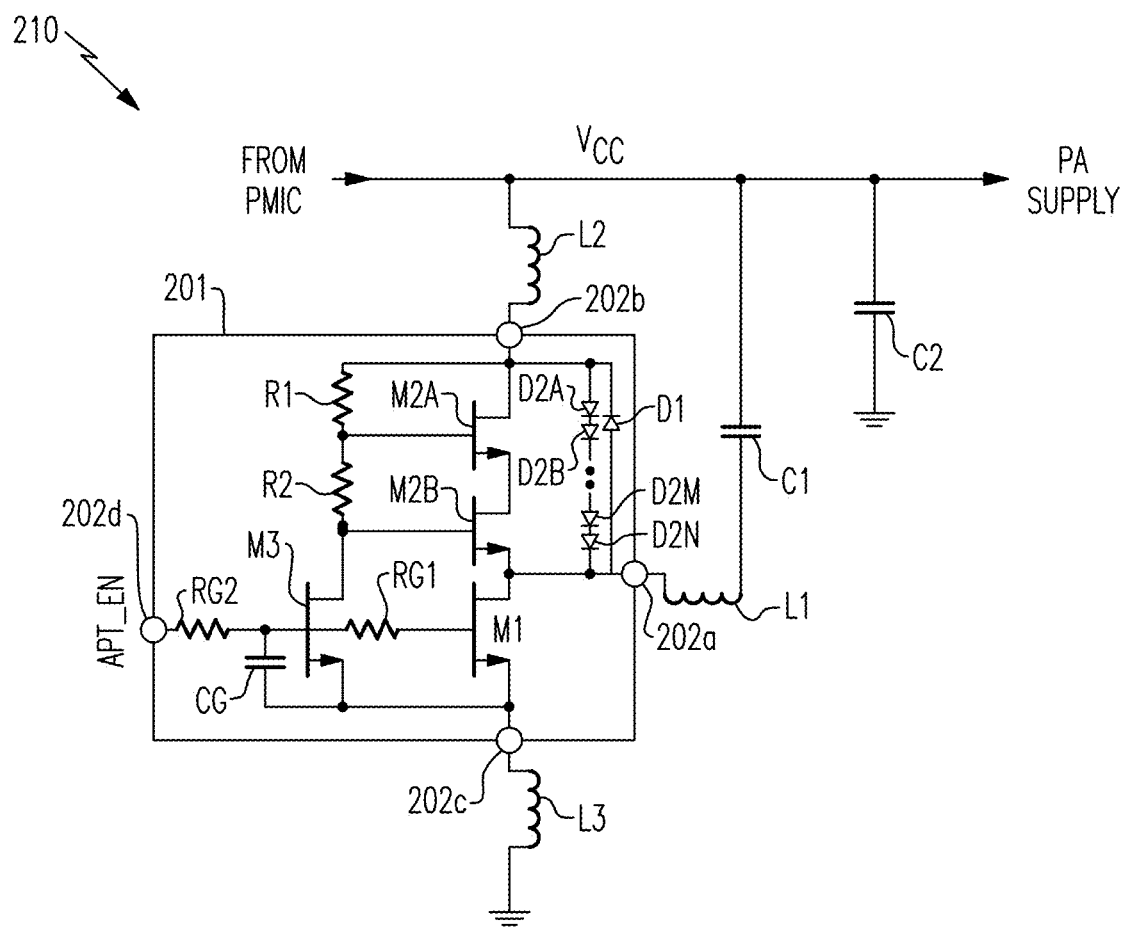
FIG. 6A is a schematic diagram of another embodiment of a power amplifier system.

FIG. 6A is a schematic diagram of another embodiment of a power amplifier system 210. The power amplifier system 210 includes a power management integrated circuit (PMIC) (not shown in FIG. 6A) that generates a power amplifier supply voltage $V_{CC}$, a power amplifier (not shown in FIG. 6A) powered by the power amplifier supply voltage $V_{CC}$, a bulk silicon switch die 201, a first supply capacitor C1, and a second supply capacitor C2. In this example, the bulk silicon switch die 201 is a flip-chip die, and bump inductances L1, L2, and L3 (corresponding to inductance of the die's bump pads) are shown for certain pads of the die 201.

In the illustrated embodiment, the bulk silicon switch die 201 includes pins or pads 202a, 202b, 202c, and 202d, a first NFET M1, second NFETs M2A/M2B, a third NFET M3, gate resistors RG1 and RG2, voltage divider resistors R1 and R2, a gate capacitor CG, and an electrostatic discharge (ESD) protection circuit including forward diode D1 and reverse diodes D2A, D2B, . . . D2M, D2N.

The pin 202b is connected (through bump inductance L2) to the supply voltage $V_{CC}$ and to a first end of the supply capacitor C1, while the pin 202a is connected (through bump inductance L1) to a second end of the supply capacitor C1. Additionally, pin 202c connects (through bump inductance L3) to ground, and pin 202d receives an APT enable signal APT_EN.

In the illustrated embodiment, the NFET M1 switches the ground side of the capacitor C1. This greatly simplifies the design in that the APD enable signal APT_EN can directly control the gate of the NFET switch without needing complex circuitry such as a charge pump to bias the gate of the switch FET.

During ET operation, care must be taken since the capacitor C1 can be fully charged and low voltage values on the supply can force the drain of the NFET ground switch (M1) below the chip ground voltage and forward bias the substrate parasitics.

In the illustrated embodiment, a discharge NFET (implemented using a series combination of M2A and M2B, in this example) activates during ET mode and shorts the capacitor C1, thereby discharging the capacitor C1 to a single diode voltage. As a result, little charge remains on the capacitor C1, and low voltage transitions of the supply $V_{CC}$ do not cause forward biasing of the substrate parasitic. The discharge NFET is also referred to as a discharge switch.

In an effort to increase robustness of the discharge switch, this device is segmented and constructed in a stacked configuration M2A/M2B, in this embodiment. Likewise, the gate bias is biased using a resistive divider R1 and R2. The result divides all drain-gate, source-gate and drain-source voltages, effectively doubling the voltage handling of the discharge switch relative to a single transistor configuration. However, the discharge switch can be implemented using more or fewer transistors.

Additional diode structure placed in parallel with the discharge switch provide ESD protection paths for this relatively small NFET structure. NFET M1 is large and provides self-protection through natural snap-back breakdown mechanism, in this example.

Using the discharge switch offers advantage of utilizing a low cost process technology through the use of NFET only switching architecture. Moreover, the relatively small FET size and absence of bias well structures offers low off-state capacitance.

Figure 6B:
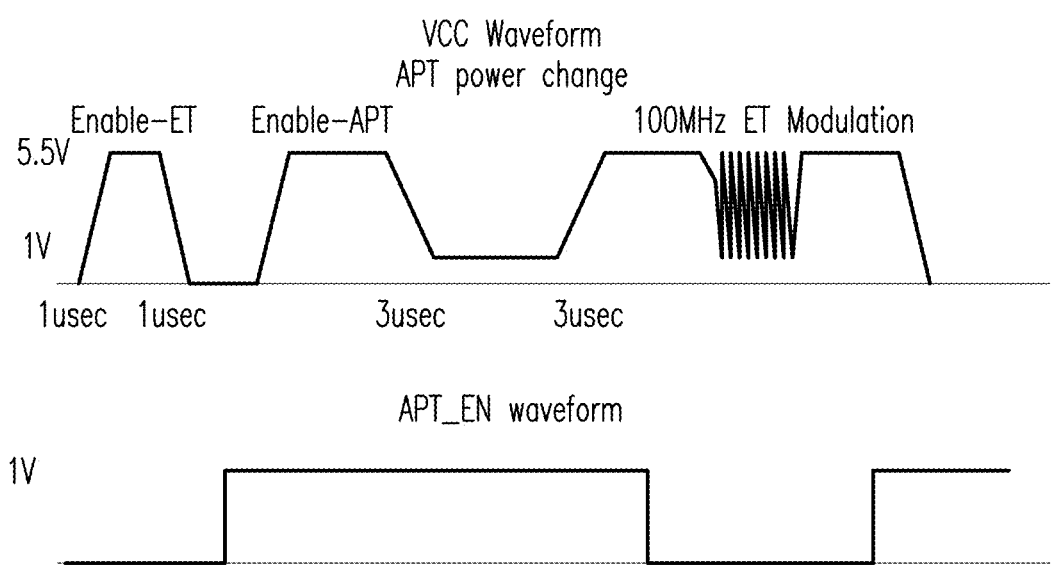
FIG. 6B is a graph of one example of supply mode switching waveforms for the power amplifier system of FIG. 6A.

FIG. 6B is a graph of one example of supply mode switching waveforms for the power amplifier system of FIG. 6A.

Example waveforms of the APT enable signal APT_EN and the supply voltage $V_{CC}$ are depicted. The supply voltage $V_{CC}$ operates with various 1 µs and 3 µs transitions as shown.

Figure 7A:
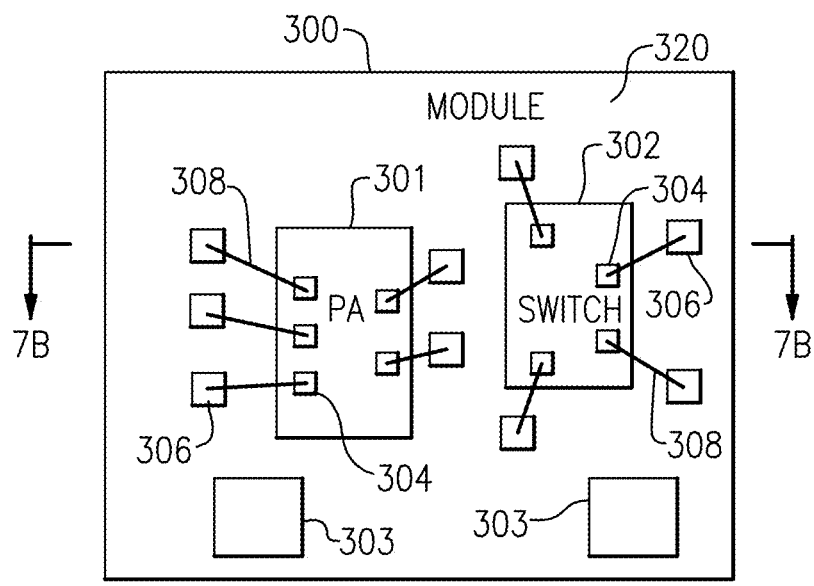
FIG. 7A is a schematic diagram of one embodiment of a packaged module.
Figure 7B:
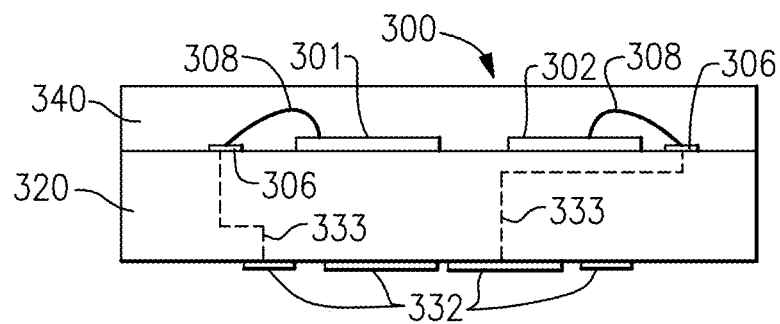
FIG. 7B is a schematic diagram of a cross-section of the packaged module of FIG. 7A taken along the lines 7B-7B.

FIG. 7A is a schematic diagram of one embodiment of a packaged module 300. FIG. 7B is a schematic diagram of a cross-section of the packaged module 300 of FIG. 7A taken along the lines 7B-7B.

The packaged module 300 includes a power amplifier die 301, a switch die 302, surface mount components 303, wirebonds 308, a package substrate 320, and encapsulation structure 340. The package substrate 320 includes pads 306 formed from conductors disposed therein. Additionally, the dies 301, 302 include pads 304, and the wirebonds 308 have been used to connect the pads 304 of the dies 301, 302 to the pads 306 of the package substrate 320.

The power amplifier die 301 and the switch die 302 are implemented in accordance with one or more features of the present disclosure. In certain implementations, the switch die 302 includes a supply capacitor switch that is in series with a supply capacitor formed at least in part using a surface mount capacitor attached to the package substrate. To enhance integration, the switch die 302 can include an antenna switch (for instance, a transmit/receive (T/R) switch) and/or a band switch. The switch die 302 can include a pin that receives a control signal indicating the supply control mode of a power management circuit (which can be included on the packaged module 300 or be external thereto).

In certain implementations, the dies 301, 302 are manufactured using different processing technologies. In one example, the power amplifier die 301 is manufactured using a heterojunction bipolar transistor (HBT) process, and the switch die 302 is manufactured using a bulk silicon process.

The packaging substrate 320 can be configured to receive a plurality of components such as the dies 301, 302 and the surface mount components 303, which can include, for example, surface mount capacitors and/or inductors.

As shown in FIG. 7B, the packaged module 300 is shown to include a plurality of contact pads 332 disposed on the side of the packaged module 300 opposite the side used to mount the dies 301, 302. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the dies 301, 302 and/or the surface mount components 303. As shown in FIG. 7B, the electric connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 8:
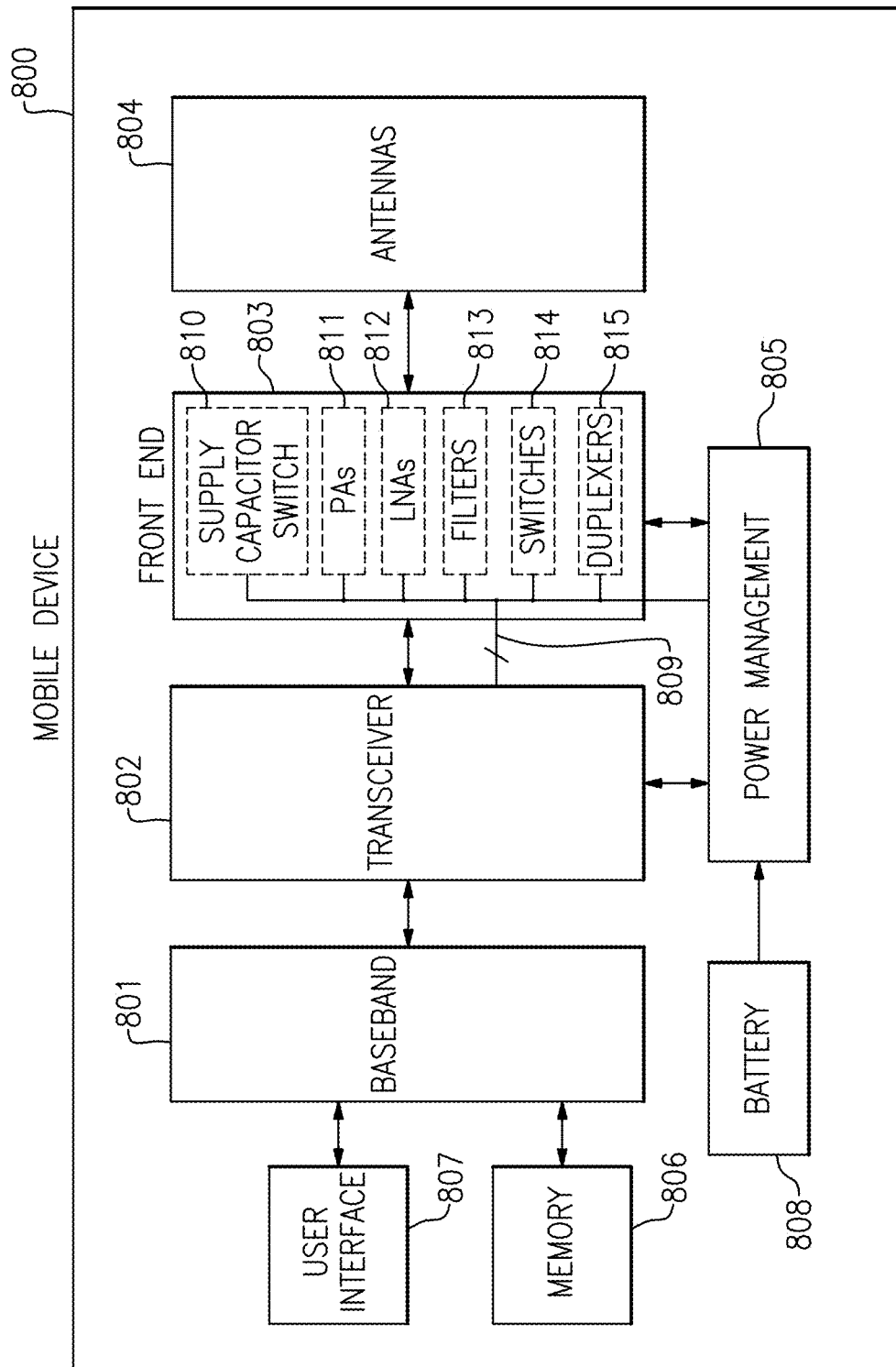
FIG. 8 is a schematic diagram of one embodiment of a mobile device.

FIG. 8 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

Although the mobile device 800 illustrates one example of an RF system that can include one or more features of the present disclosure, the teachings herein are applicable to electronic systems implemented in a wide variety of ways.

The mobile device 800 can be used to communicate using a wide variety of communications technologies, including, but not limited to, 2G, 3G, 4G (including LTE, LTE-Advanced, and LTE-Advanced Pro), 5G, WLAN (for instance, Wi-Fi®), WPAN (for instance, Bluetooth® and ZigBee®), WMAN (for instance, WiMax®), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

As shown in in FIG. 8, the transceiver 802 is connected to the front end system 803 and to the power management circuit 805 using a serial interface 809. All or part of the illustrated RF components can be controlled by the serial interface 809 to configure the mobile device 800 during initialization and/or while fully operational. In another embodiment, the baseband processor 801 is additionally or alternative connected to the serial interface 809 and operates to configure one or more RF components, such as components of the front end system 803 and/or power management system 805.

The front end system 803 aids in conditioning signals transmitted to and/or received from the antennas 804. In the illustrated embodiment, the front end system 803 includes one or more supply capacitor switches 810, one or more power amplifiers (PAs) 811, one or more low noise amplifiers (LNAs) 812, one or more filters 813, one or more switches 814, and one or more duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a power amplifier (PA) supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

The power management system 805 can operate in a selectable supply control mode, such an APT mode or an ET mode. In the illustrated embodiment, the selected supply control mode of the power management system 805 is controlled by the transceiver 802. In certain implementations, the transceiver 802 controls the selected supply control mode using the serial interface 809. The one or more supply control switches 810 are opened or closed based on the selected supply control mode.

As shown in FIG. 8, the power management system 805 receives a battery voltage from the battery 808. The battery 808 can be any suitable battery for use in the mobile device 800, including, for example, a lithium-ion battery. Although the power management system 805 is illustrated as separate from the front end system 803, in certain implementations all or part (for instance, a PA supply control circuit) of the power management system 805 is integrated into the front end system 803.

Applications

Some of the embodiments described above have provided examples in connection with wireless devices or mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a power amplifier configured to amplify a radio frequency signal;
a power management circuit configured to control a voltage level of a supply voltage of the power amplifier, the power management circuit operable in a selected supply control mode chosen from a plurality of supply control modes; and
a front end system including a supply capacitor having a first end connected to the supply voltage, an n-type field-effect transistor ground switch connected between a second end of the supply capacitor and a ground voltage, and an n-type field-effect transistor discharge switch connected between the second end of the supply capacitor and the supply voltage, the n-type field-effect transistor discharge switch including two or more n-type field-effect transistors in series, and the n-type field-effect transistor ground switch and the n-type field-effect transistor discharge switch controlled based on the selected supply control mode, the front end system further including a voltage divider configured to bias the two or more n-type field-effect transistors.

2. The mobile device of claim 1 wherein the plurality of supply control modes includes an average power tracking mode and an envelope tracking mode.

3. The mobile device of claim 2 wherein the n-type field-effect transistor ground switch is configured to turn on in the average power tracking mode and turn off in the envelope tracking mode, and the n-type field-effect transistor discharge switch is configured to turn off in the average power tracking mode and turn on in the envelope tracking mode.

4. The mobile device of claim 1 wherein the voltage divider includes a first terminal connected to the supply voltage and a second terminal connected to the ground voltage through a mode transistor.

5. The mobile device of claim 4 wherein the plurality of supply control modes includes an average power tracking mode and an envelope tracking mode, the mode transistor configured to turn on in the envelope tracking mode and turn off in the average power tracking mode.

6. The mobile device of claim 1 wherein the n-type field-effect transistor ground switch and the n-type field-effect transistor discharge switch are implemented on a semiconductor die fabricated using a bulk silicon process.

7. A power amplifier system comprising:
a power amplifier configured to amplify a radio frequency signal;
a power management circuit configured to control a voltage level of a supply voltage of the power amplifier, the power management circuit operable in a selected supply control mode chosen from a plurality of supply control modes;
a supply capacitor having a first end connected to the supply voltage;
an n-type field-effect transistor ground switch connected between a second end of the supply capacitor and a ground voltage;
an n-type field-effect transistor discharge switch connected between the second end of the supply capacitor and the supply voltage, the n-type field-effect transistor discharge switch including two or more n-type field-effect transistors in series, and the n-type field-effect transistor ground switch and the n-type field-effect transistor discharge switch controlled based on the selected supply control mode; and
a voltage divider configured to bias the two or more n-type field-effect transistors.

8. The power amplifier system of claim 7 wherein the plurality of supply control modes includes an average power tracking mode and an envelope tracking mode.

9. The power amplifier system of claim 8 wherein the n-type field-effect transistor ground switch is configured to turn on in the average power tracking mode and turn off in the envelope tracking mode, and the n-type field-effect transistor discharge switch is configured to turn off in the average power tracking mode and turn on in the envelope tracking mode.

10. The power amplifier system of claim 7 wherein the voltage divider includes a first terminal connected to the supply voltage and a second terminal connected to the ground voltage through a mode transistor.

11. The power amplifier system of claim 10 wherein the plurality of supply control modes includes an average power tracking mode and an envelope tracking mode, the mode transistor configured to turn on in the envelope tracking mode and turn off in the average power tracking mode.

12. The power amplifier system of claim 7 wherein the n-type field-effect transistor ground switch and the n-type field-effect transistor discharge switch are implemented on a semiconductor die fabricated using a bulk silicon process.

13. A method of power amplification, the method comprising:
amplifying a radio frequency signal using a power amplifier;
controlling a voltage level of a supply voltage of the power amplifier using a power management circuit, the supply voltage coupled to a first end of a supply capacitor;
operating the power management circuit in a selected supply control mode chosen from a plurality of supply control modes;

controlling an n-type field-effect transistor ground switch based on the selected supply control mode, the n-type field-effect transistor ground switch connected between a second end of the supply capacitor and a ground voltage, the n-type field-effect transistor discharge switch including two or more n-type field-effect transistors in series;

biasing the two or more n-type field-effect transistors using a voltage divider; and controlling an n-type field-effect transistor discharge switch based on the selected supply control mode, the n-type field-effect transistor ground switch connected between the second end of the supply capacitor and the supply voltage.

14. The method of claim 13 wherein the plurality of supply control modes includes an average power tracking mode and an envelope tracking mode.

15. The method of claim 14 further comprising turning on the n-type field-effect transistor ground switch in the average power tracking mode and turning off the n-type field-effect transistor ground switch in the envelope tracking mode.

16. The method of claim 14 further comprising turning off the n-type field-effect transistor discharge switch in the average power tracking mode and turning on the n-type field-effect transistor discharge switch in the envelope tracking mode.

17. The method of claim 13 wherein the voltage divider includes a first terminal connected to the supply voltage and a second terminal connected to the ground voltage through a mode transistor.

18. The method of claim 17 wherein the plurality of supply control modes includes an average power tracking mode and an envelope tracking mode, the method further comprising turning on the mode transistor in the envelope tracking mode and turning off the mode transistor in the average power tracking mode.

19. The method of claim 13 wherein the n-type field-effect transistor ground switch and the n-type field-effect transistor discharge switch are implemented on a semiconductor die fabricated using a bulk silicon process.

20. The mobile device of claim 1 further comprising an antenna configured transmit an amplified radio frequency signal provided by the power amplifier.

* * * * *